United States Patent
Shang et al.

(10) Patent No.: US 12,260,899 B2
(45) Date of Patent: Mar. 25, 2025

(54) DECODER DRIVER CIRCUIT AND MEMORY CHIP

(71) Applicant: CHANGXIN MEMORY TECHNOLOGIES, INC., Hefei (CN)

(72) Inventors: Weibing Shang, Hefei (CN); Xianjun Wu, Hefei (CN); Minghao Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

(21) Appl. No.: 18/155,079

(22) Filed: Jan. 17, 2023

(65) Prior Publication Data
US 2023/0170011 A1  Jun. 1, 2023

Related U.S. Application Data

(63) Continuation of application No. PCT/CN2022/108164, filed on Jul. 27, 2022.

(30) Foreign Application Priority Data

Aug. 25, 2021  (CN) .......................... 202110981627.X

(51) Int. Cl.
G11C 11/4074 (2006.01)
G11C 11/408 (2006.01)

(52) U.S. Cl.
CPC ...... G11C 11/4087 (2013.01); G11C 11/4074 (2013.01); G11C 11/4085 (2013.01)

(58) Field of Classification Search
CPC ............ G11C 11/4087; G11C 11/4074; G11C 11/4085

USPC ..................................................... 365/230.06
See application file for complete search history.

(56) References Cited

U.S. PATENT DOCUMENTS

| 6,088,252 | A | 7/2000 | Fujisawa et al. |
| 2007/0147161 | A1 | 6/2007 | Cho et al. |
| 2011/0222360 | A1* | 9/2011 | Takeda ................. G11C 11/413 365/230.06 |
| 2020/0342929 | A1* | 10/2020 | Suzuki ..................... G11C 7/00 |
| 2021/0057008 | A1* | 2/2021 | Kim ......................... G11C 8/08 |
| 2021/0142849 | A1 | 5/2021 | Yabuuchi |

FOREIGN PATENT DOCUMENTS

| CN | 101047022 A | 10/2007 |
| CN | 101694780 A | 4/2010 |
| CN | 113192544 A | 7/2021 |

* cited by examiner

*Primary Examiner* — Huan Hoang
*Assistant Examiner* — Daniel J King
(74) *Attorney, Agent, or Firm* — Kilpatrick Townsend & Stockton LLP

(57) ABSTRACT

Embodiments relate to a decoder driver circuit and a memory chip. The decoder driver circuit includes: a plurality of sub drive units configured to generate a main word line drive signal according to a power supply voltage signal, a first decoding input signal and an intermediate decoding output signal; and a plurality of decoding control circuits connected to the plurality of sub drive units, where the plurality of decoding control circuits are configured to generate the intermediate decoding output signal according to an enable control signal and a second decoding input signal. When the intermediate decoding output signal is in a first state, the main word line drive signal is in a non-drive state.

19 Claims, 4 Drawing Sheets

DECODER DRIVER CIRCUIT AND MEMORY CHIP

CROSS-REFERENCE TO RELATED APPLICATION

The present disclosure is a continuation of PCT/CN2022/108164, filed on Jul. 27, 2022, which claims priority to Chinese Patent Application No. 202110981627.X titled "DECODER DRIVER CIRCUIT AND MEMORY CHIP" and filed to the State Patent Intellectual Property Office on Aug. 25, 2021, the entire contents of which are incorporated herein by reference.

TECHNICAL FIELD

The present disclosure relates to the field of integrated circuits, and more particularly, to a decoder driver circuit and a memory chip.

BACKGROUND

With the rapid development of semiconductor and integrated circuit technologies, the market has higher and higher requirements for storage capacity per unit area of semiconductor memory chips.

A semiconductor memory chip typically includes a storage array area and a peripheral circuit region, where the storage array area is provided with a memory cell array including a plurality of memory cells, and the peripheral circuit region is provided with a control circuit configured to control read or write and a mode register configured to set storage parameters. The control circuit configured to control read or write includes a sense amplifier circuit, a data input/output conversion circuit, and a row/column decoder circuit and a control circuit thereof, etc.

If a volume of a decoder driver circuit in the row decoder circuit can be reduced without reducing the storage capacity of the storage array area, it is undoubted that a volume of the peripheral circuit region of the semiconductor memory chip can be effectively reduced, such that the storage capacity per unit area can be relatively improved for the semiconductor memory chip.

SUMMARY

According to various embodiments of the present disclosure, a decoder driver circuit and a memory chip are provided.

According to some embodiments, one aspect of the present disclosure provides a decoder driver circuit, including a plurality of sub drive units and a plurality of decoding control circuits. The plurality of sub drive units are configured to generate a main word line drive signal according to a power supply voltage signal, a first decoding input signal, and an intermediate decoding output signal. The plurality of decoding control circuits are connected to the plurality of sub drive units, and the plurality of decoding control circuits are configured to generate the intermediate decoding output signal according to an enable control signal and a second decoding input signal, where when the intermediate decoding output signal is in a first state, the main word line drive signal is in a non-drive state.

According to some embodiments, each of the plurality of sub drive units comprises a first transistor, a second transistor, and a third transistor. A source of the first transistor is connected to the power supply voltage signal, and a gate of the first transistor is connected to the first decoding input signal. A source of the second transistor is connected to the power supply voltage signal, and a gate of the second transistor is connected to the intermediate decoding output signal. A source of the third transistor is connected to a given one the plurality of decoding control circuits, a drain of the third transistor is connected to both a drain of the first transistor and a drain of the second transistor, and a gate of the third transistor is connected to both the gate of the first transistor and the first decoding input signal. In this embodiment, the first transistor and the third transistor are arranged to constitute an inverter whose control terminal is connected to the first decoding input signal, an output terminal of the inverter is connected to an output terminal of the second transistor, a control terminal of the second transistor is connected to the intermediate decoding output signal, and an input terminal of the second transistor is connected to the power supply voltage signal, such that the plurality of sub drive units generate the main word line drive signal according to the power supply voltage signal, the first decoding input signal, and the intermediate decoding output signal, to implement control of a plurality of local word line drivers by controlling the plurality of sub drive units by means of one decoding control circuit.

According to some embodiments, the enable control signal comprises a first enable control signal and a second enable control signal; and the given decoding control circuit comprises a first inverter, a fourth transistor, a fifth transistor, a sixth transistor, a seventh transistor, and a second decoding signal receiver unit. A power supply terminal of the first inverter is connected to a first power supply, and an output terminal of the first inverter is connected to the gate of the second transistor. A source of the fourth transistor is grounded, a drain of the fourth transistor is connected to the source of the third transistor, and a gate of the fourth transistor is connected to both the gate of the second transistor and the output terminal of the first inverter. A source of the fifth transistor is connected to the first power supply, a drain of the fifth transistor is connected to an input terminal of the first inverter, and a gate of the fifth transistor is connected to both the output terminal of the first inverter and the gate of the second transistor. A source of the sixth transistor is connected to the first power supply, a drain of the sixth transistor is connected to both the input terminal of the first inverter and the drain of the fifth transistor, and a gate of the sixth transistor is connected to the first enable control signal. A source of the seventh transistor is connected to the second decoding signal receiver unit, a drain of the seventh transistor is connected to both the drain of the sixth transistor and the input terminal of the first inverter, and a gate of the seventh transistor is connected to the second enable control signal.

According to some embodiments, the second decoding input signal comprises a second primary decoding input signal and a second secondary decoding input signal; and the second decoding signal receiver unit comprises an eighth transistor and a ninth transistor. A drain of the eighth transistor is connected to the source of the seventh transistor, and a gate of the eighth transistor is connected to the second primary decoding input signal. A source of the ninth transistor is grounded, a drain of the ninth transistor is connected to the source of the eighth transistor, and a gate of the ninth transistor is connected to the second secondary decoding input signal.

According to some embodiments, the decoder driver circuit further includes an enable control circuit connected to the plurality of decoding control circuits, and the enable control circuit is configured to provide the first enable control signal and the second enable control signal to the plurality of decoding control circuits according to a main word line enable signal.

According to some embodiments, the enable control circuit includes a second inverter, a third inverter, and a fourth inverter. An input terminal of the second inverter is connected to the main word line enable signal, and a power supply terminal of the second inverter is connected to the first power supply. An input terminal of the third inverter is connected to an output terminal of the second inverter, a power supply terminal of the third inverter is connected to the first power supply, and an output terminal of the third inverter is configured to output the first enable control signal. An input terminal of the fourth inverter is connected to the output terminal of the second inverter, a power supply terminal of the fourth inverter is connected to a second power supply, and an output terminal of the fourth inverter is configured to output the second enable control signal.

According to some embodiments, an amplitude of an output voltage of the first power supply is greater than an amplitude of an output voltage of the second power supply.

According to some embodiments, the decoder driver circuit further includes a power supply control circuit connected to each of the plurality of sub drive units, and the power supply control circuit is configured to provide the power supply voltage signal to each of the plurality of sub drive units. Furthermore, the power supply control circuit is further configured to output power supply voltage signals having different voltage amplitudes according to a power supply control signal.

According to some embodiments, the power supply control signal comprises a first sub power supply control signal and a second sub power supply control signal; and the power supply control circuit comprises a first power supply control unit and a second power supply control unit. The first power supply control unit is connected to a third power supply, the first sub power supply control signal, and the second sub power supply control signal. The first power supply control unit is configured to generate a power supply voltage signal having a first amplitude according to the first sub power supply control signal and the second sub power supply control signal. The second power supply control unit is connected to the first power supply and an inversion signal of the second sub power supply control signal. The second power supply control unit is configured to generate a power supply voltage signal having a second amplitude according to the inversion signal of the second sub power supply control signal.

According to some embodiments, the power supply control circuit further comprises a third power supply control unit, which is connected to the first power supply and an inversion signal of the first sub power supply control signal. The third power supply control unit is configured to generate a power supply voltage signal having a third amplitude according to the inversion signal of the first sub power supply control signal.

According to some embodiments, the first power supply control unit comprises a tenth transistor and an eleventh transistor. A source of the tenth transistor is connected to the third power supply, and a gate of the tenth transistor is connected to the first sub power supply control signal. A source of the eleventh transistor is connected to a drain of the tenth transistor, a gate of the eleventh transistor is connected to the second sub power supply control signal, and a drain of the eleventh transistor is configured to output the power supply voltage signal having the first amplitude.

According to some embodiments, the second power supply control unit comprises a twelfth transistor and a thirteenth transistor. A source of the twelfth transistor is connected to the first power supply, and a gate of the twelfth transistor is connected to a drain thereof. A source of the thirteenth transistor is connected to a drain of the twelfth transistor, a gate of the thirteenth transistor is connected to the inversion signal of the second sub power supply control signal, and a drain of the thirteenth transistor is configured to output the power supply voltage signal having the second amplitude.

According to some embodiments, the third power supply control unit comprises a fourteenth transistor. A source of the fourteenth transistor is connected to the first power supply, a gate of the fourteenth transistor is connected to the inversion signal of the first sub power supply control signal, and a drain of the fourteenth transistor is configured to output the power supply voltage signal having the third amplitude.

According to some embodiments, an amplitude of an output voltage of the third power supply is smaller than the amplitude of the output voltage of the first power supply; and the first amplitude is greater than the second amplitude, and the second amplitude is greater than the third amplitude.

According to some embodiments, another aspect of the present disclosure provides a memory chip, which includes the decoder driver circuit in any one of the embodiments of the present disclosure.

The embodiments of the present disclosure may/at least have the following advantages.

In the decoder driver circuit and the memory chip provided by the embodiments of the present disclosure, a plurality of decoding control circuits are connected to a plurality of sub drive units, and the plurality of decoding control circuits generate an intermediate decoding output signal according to the enable control signal and the second decoding input signal, and provide the intermediate decoding output signal to each of the plurality of sub drive units, such that each of the plurality of sub drive units generates a main word line drive signal according to a power supply voltage signal, a first decoding input signal, and the intermediate decoding output signal. The main word line drive signal works in coordination with a word line drive signal and a word line reset signal to implement the control of the plurality of local word line drivers in a row decoder circuit. In this embodiment, the control of the plurality of local word line drivers is implemented by controlling the plurality of sub drive units by means of one decoding control circuit, and thus a volume of the decoder driver circuit in the row decoder circuit can be reduced without reducing a storage capacity of a storage array area, to effectively reduce a volume of a peripheral circuit region of a semiconductor memory chip, such that the storage capacity per unit area can be relatively improved for the semiconductor memory chip.

In conclusion, the decoder driver circuit and the memory chip provided by the embodiments of the present disclosure can reduce the volume of the decoder driver circuit in the row decoder circuit without reducing the storage capacity of the storage array area.

Details of one or more embodiments of the present disclosure are set forth in the following drawings and descriptions. Other features, objectives, and advantages of the present disclosure will become apparent from the description, the drawings, and the claims.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

In addition, certain terms used throughout the specification and the following claims refer to particular components. Those skilled in the art will understand that manufacturers may represent components with different names. This document does not intend to distinguish between components with different names but the same functions. In the following description and embodiments, the terms "including" and "comprising" are used in an open-ended fashion, and thus should be interpreted as "including, but not limited to . . . " Likewise, the term "connection" is intended to express an indirect or direct electrical connection. Correspondingly, if one device is connected to another device, the connection between the two devices may be achieved by means of a direct electrical connection, or by means of an indirect electrical connection of other devices and connectors.

It should be understood that although terms such as "first", "second" and the like may be used herein to describe various components, these components should not be limited by these terms. These terms are only intended to distinguish one component from another one. For example, a first component may be termed a second component, and similarly, a second component may be termed a first component, without departing from the scope of the present disclosure.

Figure 1:
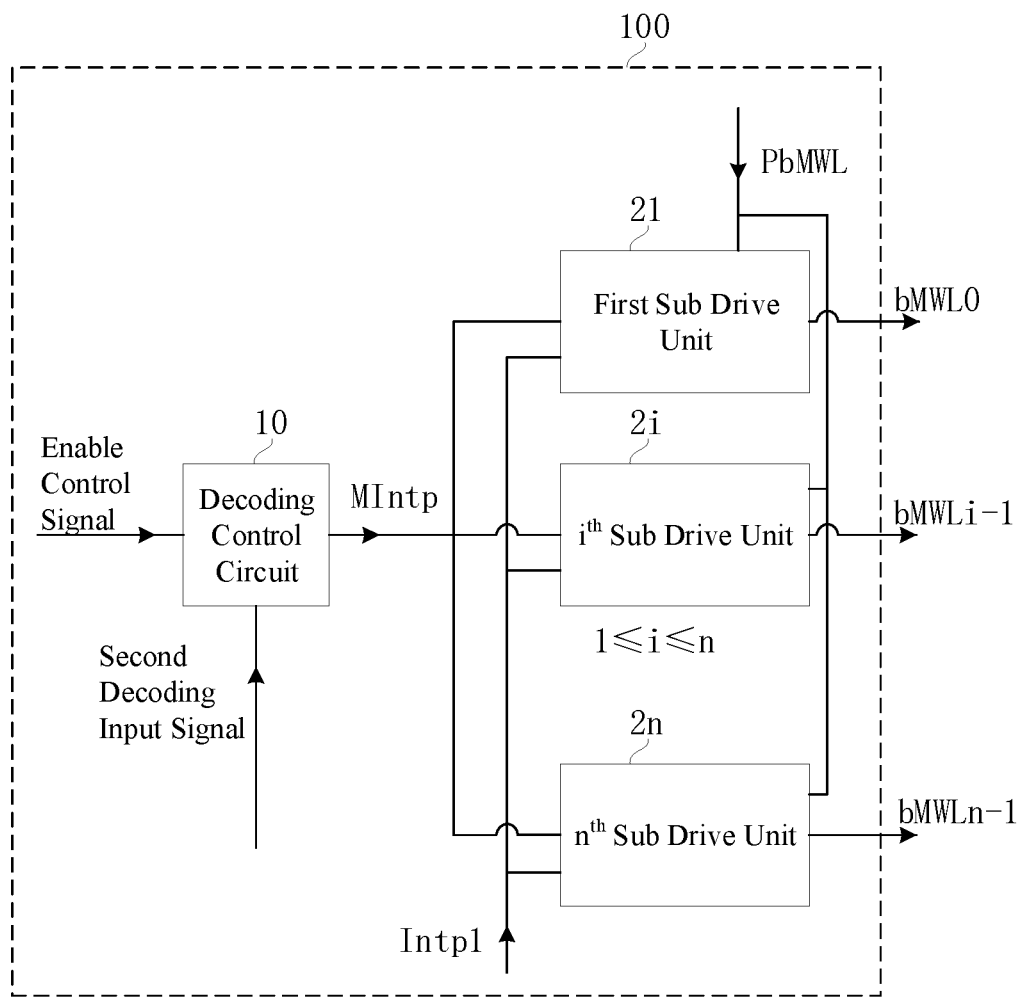
FIG. 1 is a structural block diagram of a decoder driver circuit provided in an embodiment of the present disclosure.

Referring to FIG. 1, in an embodiment of the present disclosure, a decoder driver circuit 100 is provided, which includes a first sub drive unit 21, an $i^{th}$ sub drive unit 2i, an $n^{th}$ sub drive unit 2n, and a decoding control circuit 10. The $i^{th}$ sub drive unit 2i is configured to generate a main word line drive signal according to a power supply voltage signal, a first decoding input signal Intp1, and an intermediate decoding output signal MIntp. The decoding control circuit 10 is connected to the first sub drive unit 21, the $i^{th}$ sub drive unit 2i, and the $n^{th}$ sub drive unit 2n. The decoding control circuit 10 is configured to generate the intermediate decoding output signal MIntp according to an enable control signal and a second decoding input signal, where when the intermediate decoding output signal MIntp is in a first state, the main word line drive signal is in a non-drive state. The first sub drive unit 21 generates a main word line drive signal bMWL0 according to the power supply voltage signal, the first decoding input signal Intp1, and the intermediate decoding output signal MIntp. The $i^{th}$ sub drive unit 2i generates a main word line drive signal bMWLi-1 according to the power supply voltage signal, the first decoding input signal Intp1, and the intermediate decoding output signal MIntp. The $n^{th}$ sub drive unit 2n generates a main word line drive signal bMWLn-1 according to the power supply voltage signal, the first decoding input signal Intp1, and the intermediate decoding output signal MIntp. In this embodiment, $1 \leq i \leq n$, both i and n are positive integers, and n represents number of the sub drive units.

In some embodiments, with continued reference to FIG. 1, the decoding control circuit 10 is connected to a plurality of sub drive units, and the decoding control circuit 10 generates the intermediate decoding output signal MIntp according to the enable control signal and the second decoding input signal, and provides the intermediate decoding output signal MIntp to each of the plurality of sub drive units, such that each of the plurality of sub drive units generates a main word line drive signal according to the power supply voltage signal, the first decoding input signal Intp1, and the intermediate decoding output signal MIntp. The main word line drive signal works in coordination with a word line drive signal and a word line reset signal to implement the control of a plurality of local word line drivers in a row decoder circuit. When the intermediate decoding output signal MIntp is in a first state, the main word line drive signal is in a non-drive state, such that a word line correspondingly connected to a backward stage remains a nonactivated state. When the intermediate decoding output signal MIntp is in a second state, the main word line drive signal is in a drive state, such that the word line correspondingly connected to the backward stage is driven to remain an activated state. In this embodiment, the control of the plurality of local word line drivers is implemented by controlling the plurality of sub drive units by means of one decoding control circuit 10, and thus a volume of the decoder driver circuit 100 in the row decoder circuit can be reduced without reducing a storage capacity of a storage array area, to effectively reduce a volume of a peripheral circuit region of a semiconductor memory chip, such that the storage capacity per unit area can be relatively improved for the semiconductor memory chip.

Figure 2:
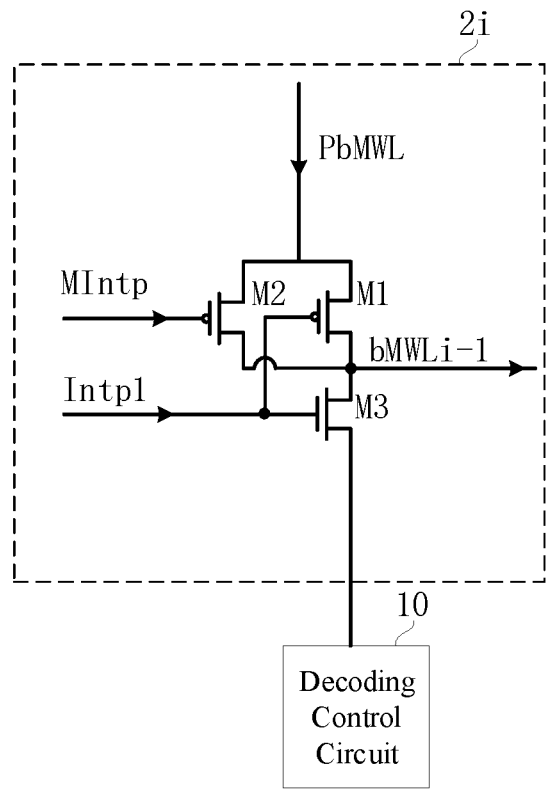
FIG. 2 is a schematic circuit diagram of an $i^{th}$ sub drive unit in a decoder driver circuit provided in an embodiment of the present disclosure, where $1 \leq i \leq n$, both i and n are positive integers, and n represents number of sub drive units.

As an example, referring to FIG. 2, the $i^{th}$ sub drive unit 2i may include a first transistor M1, a second transistor M2, and a third transistor M3. A source of the first transistor M1 is connected to the power supply voltage signal PbMWL, and a gate of the first transistor M1 is connected to the first decoding input signal Intp1. A source of the second transistor M2 is connected to the power supply voltage signal PbMWL, and a gate of the second transistor M2 is connected to the intermediate decoding output signal MIntp. A source of the third transistor M3 is connected to the decoding control circuit 10, a drain of the third transistor M3 is connected to both a drain of the first transistor M1 and a drain of the second transistor M2, and a gate of the third transistor M3 is connected to both the gate of the first transistor M1 and the first decoding input signalIntp1. In this example, 1≤i≤n, both i and n are positive integers, and n represents number of the sub drive units. In this embodiment, the first transistor M1 and the third transistor M3 are arranged to constitute an inverter whose control terminal is connected to the first decoding input signal Intp1, an output terminal of the inverter is connected to an output terminal of the second transistor M2, the gate of the second transistor M2 is connected to the intermediate decoding output signal MIntp and an input terminal of the second transistor M2 is connected to the power supply voltage signal, such that a plurality of sub drive units 20 correspondingly connected generate the main word line drive signal according to the power supply voltage signal PbMWL, the first decoding input signal Intp1, and the intermediate decoding output signal MIntp, to drive the word line connected to the backward stage to implement control of a plurality of local word line drivers by controlling the plurality of sub drive units 20 by means of one decoding control circuit 10.

Figure 3:
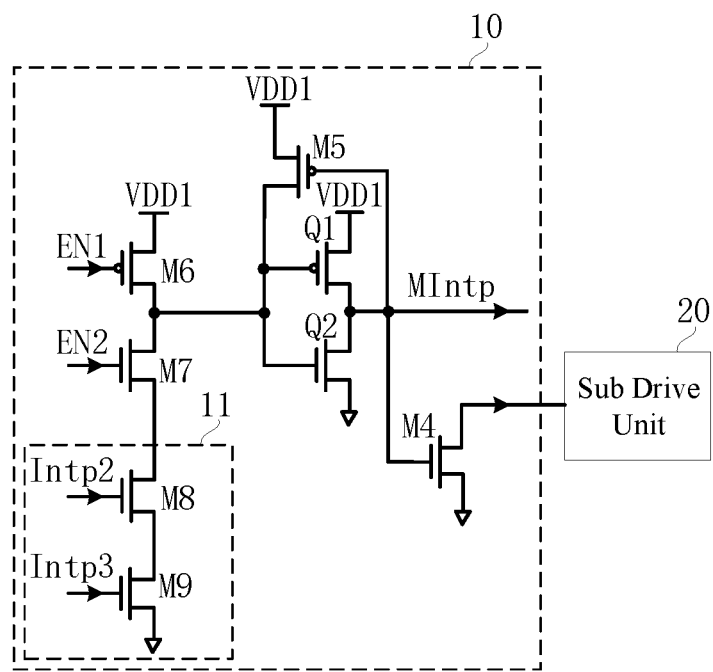
FIG. 3 is a schematic circuit diagram of a decoding control circuit in a decoder driver circuit provided in an embodiment of the present disclosure.

As an example, referring to FIG. 3, the enable control signal may comprise a first enable control signal EN1 and a second enable control signal EN2. The decoding control circuit 10 comprises a first inverter (not shown), a fourth transistor M4, a fifth transistor M5, a sixth transistor M6, a seventh transistor M7, and a second decoding signal receiver unit 11. A power supply terminal of the first inverter is connected to a first power supply VDD1, and an output terminal of the first inverter is connected to the gate of the second transistor M2. A source of the fourth transistor M4 is grounded, a drain of the fourth transistor M4 is connected to the source of the third transistor M3, and a gate of the fourth transistor M4 is connected to both the gate of the second transistor M2 and the output terminal of the first inverter. A source of the fifth transistor M5 is connected to the first power supply VDD1, a drain of the fifth transistor M5 is connected to an input terminal of the first inverter, and a gate of the fifth transistor M5 is connected to both the output terminal of the first inverter and the gate of the second transistor M2. A source of the sixth transistor M6 is connected to the first power supply VDD1, a drain of the sixth transistor M6 is connected to both the input terminal of the first inverter and the drain of the fifth transistor M5, and a gate of the sixth transistor M6 is connected to the first enable control signal EN1. A source of the seventh transistor M7 is connected to the second decoding signal receiver unit 11, a drain of the seventh transistor M7 is connected to both the drain of the sixth transistor M6 and the input terminal of the first inverter, and a gate of the seventh transistor M7 is connected to the second enable control signal EN2. The decoding control circuit 10 provides the corresponding intermediate decoding output signal MIntp to a sub drive unit 20 connected to the backward stage according to the first enable control signal EN1, the second enable control signal EN2, and a signal provided by the second decoding signal receiver unit 11, such that the sub drive unit 20 can generate the main word line drive signal according to the power supply voltage signal PbMWL, the first decoding input signal Intp1 and the intermediate decoding output signal MIntp, to drive the word line connected to the backward stage. In this embodiment, it is achievable that when the intermediate decoding output signal MIntp is in the first state, the main word line drive signal outputted by each sub drive unit 20 connected to the backward stage is driven to be in the non-drive state, such that the word line correspondingly connected to the backward stage remains the nonactivated state; and it is achievable that when the intermediate decoding output signal MIntp is in the second state, the main word line drive signal outputted by each sub drive unit 20 connected to the backward stage is driven to be in the drive state, such that the word line correspondingly connected to the backward stage is driven to remain the activated state.

As an example, referring to FIG. 3, the first inverter may include a transistor Q1 and a transistor Q2. A source of the transistor Q1 is connected to the first power supply VDD1, and a gate of the transistor Q1 is connected to the drain of the fifth transistor M5. A source of the transistor Q2 is grounded, a drain of the transistor Q2 is connected to a drain of transistor Q1 and serves as the output terminal of the first inverter, and a gate of the transistor Q2 is connected to the gate of transistor Q1 and serves as the input terminal of the first inverter.

As an example, with continued reference to FIG. 3, the second decoding input signal comprises a second primary decoding input signal Intp2 and a second secondary decoding input signal Intp3; and the second decoding signal receiver unit 11 comprises an eighth transistor M8 and a ninth transistor M9. A drain of the eighth transistor M8 is connected to the source of the seventh transistor M7, and a gate of the eighth transistor M8 is connected to the second primary decoding input signal Intp2. A source of the ninth transistor M9 is grounded, a drain of the ninth transistor M9 is connected to the source of the eighth transistor M8, and a gate of the ninth transistor M9 is connected to the second secondary decoding input signal Intp3. The second decoding signal receiver unit 11 provides a source signal to the seventh transistor M7 according to the second primary decoding input signal Intp2 and the second secondary decoding input signal Intp3, and controls, in coordination with the first enable control signal EN1 and the second enable control signal EN2, the sixth transistor M6 and the seventh transistor M7 to act to provide a drive signal to a backward stage circuit, allowing the decoding control circuit 10 to provide the corresponding intermediate decoding output signal to the sub drive unit 20 connected to the backward stage, such that the sub drive unit 20 can generate the main word line drive signal according to the power supply voltage signal PbMWL, the first decoding input signal Intp1 and the intermediate decoding output signal MIntp, to drive the word line connected to the backward stage.

Figure 4:
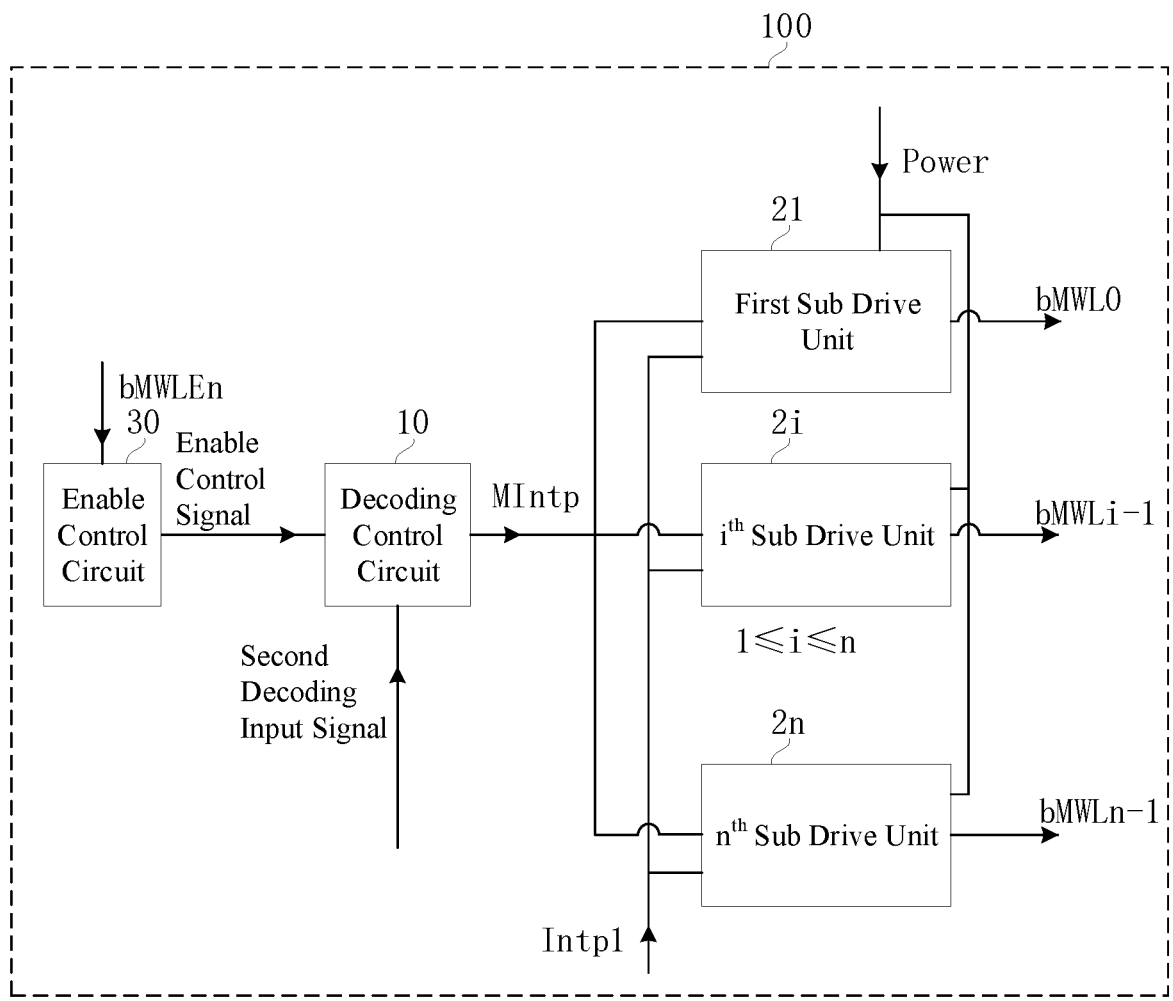
FIG. 4 is a structural block diagram of a decoder driver circuit provided in another embodiment of the present disclosure.

As an example, referring to FIG. 4, the decoder driver circuit 100 further includes an enable control circuit 30 connected to the plurality of decoding control circuits 10, and the enable control circuit 30 is configured to provide the first enable control signal EN1 and the second enable control signal EN2 to the plurality of decoding control circuits 10 according to a main word line enable signal bMWLEn.

Figure 5:
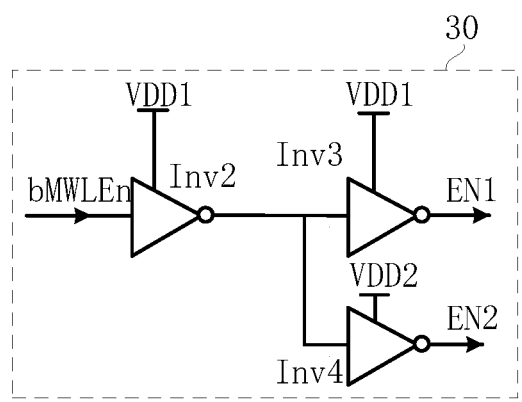
FIG. 5 is a schematic circuit diagram of an enable control circuit in a decoder driver circuit provided in an embodiment of the present disclosure.

As an example, referring to FIG. 5, the enable control circuit 30 includes a second inverter Inv2, a third inverter Inv3, and a fourth inverter Inv4. An input terminal of the second inverter Inv2 is connected to the main word line enable signal bMWLEn, and a power supply terminal of the second inverter Inv2 is connected to the first power supply VDD1. An input terminal of the third inverter Inv3 is connected to an output terminal of the second inverter Inv2, a power supply terminal of the third inverter Inv3 is connected to the first power supply VDD1, and an output terminal of the third inverter Inv3 is configured to output the first enable control signal EN1. An input terminal of the fourth inverter Inv4 is connected to the output terminal of the second inverter Inv2, a power supply terminal of the fourth inverter Inv4 is connected to a second power supply VDD2, and an output terminal of the fourth inverter Inv4 is configured to output the second enable control signal EN2. It may be set that an amplitude of an output voltage of the first power supply VDD1 is greater than an amplitude of an output voltage of the second power supply VDD2.

As an example, with continued reference to FIG. 5, the amplitude of the output voltage of the first power supply VDD1 may be set to be 3V, and the amplitude of the output voltage of the second power supply VDD2 may be set to be 1.6V.

Figure 6:
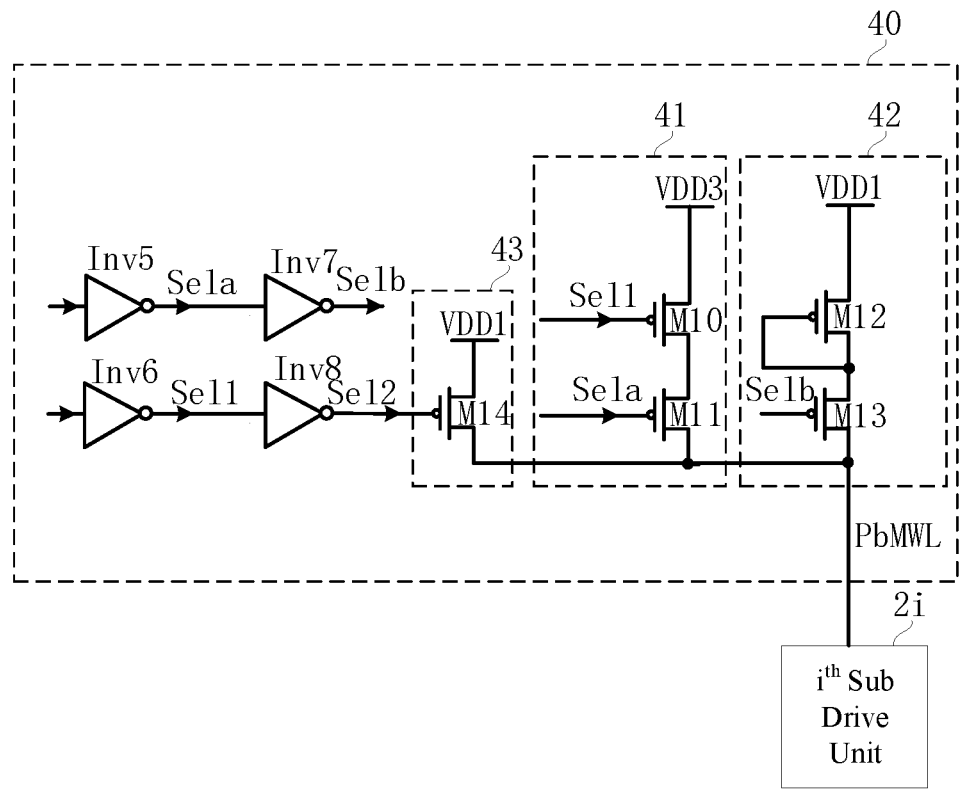
FIG. 6 is a schematic circuit diagram of a power supply control circuit in a decoder driver circuit provided in an embodiment of the present disclosure.

As an example, referring to FIG. 6, the decoder driver circuit further includes a power supply control circuit 40 connected to each of the plurality of sub drive units, and the power supply control circuit 40 is configured to provide the power supply voltage signal to each of the plurality of sub drive units. Furthermore, the power supply control circuit 40 is further configured to output power supply voltage signals having different voltage amplitudes according to a power supply control signal.

As an example, with continued reference to FIG. 6, the power supply control signal may comprise a first sub power supply control signal Sel1 and a second sub power supply control signal Sela; and the power supply control circuit 40 comprises a first power supply control unit 41 and a second power supply control unit 42. The first power supply control unit 41 is connected to a third power supply VDD3, the first sub power supply control signal Sel1, and the second sub power supply control signal Sela. The first power supply control unit 41 is configured to generate a power supply voltage signal having a first amplitude according to the first sub power supply control signal Sel1 and the second sub power supply control signal Sela. The second power supply control unit 42 is connected to the first power supply VDD1 and an inversion signal Selb of the second sub power supply control signal. The second power supply control unit 42 is configured to generate a power supply voltage signal having a second amplitude according to the inversion signal Selb of the second sub power supply control signal.

As an example, with continued reference to FIG. 6, the first power supply control unit 41 may comprise a tenth transistor M10 and an eleventh transistor M11. A source of the tenth transistor M10 is connected to the third power supply VDD3, and a gate of the tenth transistor M10 is connected to the first sub power supply control signal Sel1. A source of the eleventh transistor M11 is connected to a drain of the tenth transistor M10, a gate of the eleventh transistor M11 is connected to the second sub power supply control signal Sela, and a drain of the eleventh transistor M11 is configured to output the power supply voltage signal having the first amplitude.

As an example, with continued reference to FIG. 6, the second power supply control unit 42 may comprise a twelfth transistor M12 and a thirteenth transistor M13. A source of the twelfth transistor M12 is connected to the first power supply VDD1, and a gate of the twelfth transistor M12 is connected to a drain thereof. A source of the thirteenth transistor M13 is connected to a drain of the twelfth transistor M12, a gate of the thirteenth transistor M13 is connected to the inversion signal Selb of the second sub power supply control signal, and a drain of the thirteenth transistor M13 is configured to output the power supply voltage signal having the second amplitude.

As an example, with continued reference to FIG. 6, the amplitude of the output voltage of the first power supply VDD1 may be set to 3V, and the amplitude of the output voltage of the third power supply VDD3 may be set to 1.8V, such that the first power supply control unit 41 can output a power supply voltage signal of 3 v-Vt, and the second power supply control unit 42 can output a power supply voltage signal of 1.8 v.

As an example, with continued reference to FIG. 6, the power supply control circuit 40 may further comprise a third power supply control unit 43, which is connected to the first power supply VDD1 and an inversion signal Sel2 of the first sub power supply control signal. The third power supply control unit 43 is configured to generate a power supply voltage signal having a third amplitude according to the inversion signal Sel2 of the first sub power supply control signal.

As an example, with continued reference to FIG. 6, the third power supply control unit 43 may comprise a fourteenth transistor M14. A source of the fourteenth transistor M14 is connected to the first power supply VDD1, a gate of the fourteenth transistor M14 is connected to the inversion signal Sel2 of the first sub power supply control signal, and a drain of the fourteenth transistor M14 is configured to output the power supply voltage signal having the third amplitude. For example, the amplitude of the output voltage of the first power supply VDD1 may be set to 3V, such that the third power supply control unit 43 can output a power supply voltage signal of 3V.

As an example, with continued reference to FIG. 6, the amplitude of the output voltage of the third power supply VDD3 may be set to be smaller than that of the output voltage of the first power supply VDD1, the first amplitude is greater than the second amplitude, and the second amplitude is greater than the third amplitude. For example, the amplitude of the output voltage of the first power supply VDD1 may be set to 3V, and the amplitude of the output voltage of the third power supply VDD3 may be set to 1.8V, such that the first power supply control unit 41 can output the power supply voltage signal of 3 v-Vt, the second power supply control unit 42 can output the power supply voltage signal of 1.8 v, and the third power supply control unit 43 can output the power supply voltage signal of 3 v. When a drive circuit of the power supply control circuit 40 is in frequent operation, the third power supply control unit 43 may be controlled to output the power supply voltage signal of 3 v to reduce power consumption caused by frequently switching the power supply voltage signal. When the drive circuit of the power supply control circuit 40 is in a standby state, the first power supply control unit 41 may be controlled to output the power supply voltage signal of 3 v-Vt, to reduce the power consumption and prepare for operating power of the drive circuit. When the drive circuit of the power supply control circuit 40 is in a standby state for a longer period, the second power supply control unit 42 may be controlled to output the power supply voltage signal of 1.8 v, to reduce the power consumption of the circuit.

As an example, with continued reference to FIG. 6, the second sub power supply control signal Sela may be connected to a control circuit (not shown) via the inverter Inv5, and the first sub power supply control signal Sel1 may be connected to the control circuit via the inverter Inv6, such that the control circuit can control the power supply control circuit 40 to output a power supply voltage signal having a corresponding amplitude according to an actual operating state of the drive circuit of the power supply control circuit 40, to reduce the power consumption of the circuit.

Figure 7:
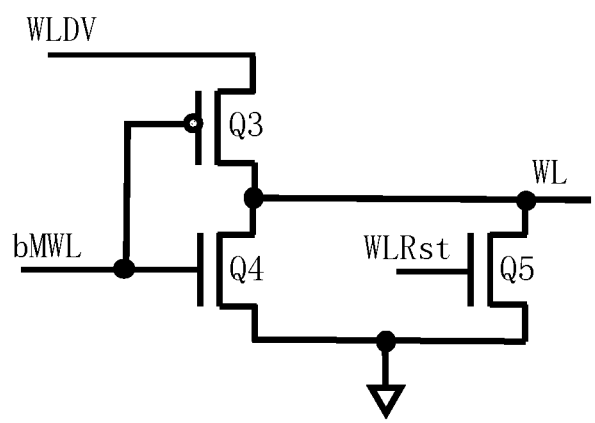
FIG. 7 is a schematic circuit diagram of a local word line driver provided in an embodiment of the present disclosure.

As an example, referring to FIG. 7, the local word line driver (LWD) includes a transistor Q3, a transistor Q4, and a transistor Q5. A source of the transistor Q3 is connected to the word line drive signal WLDV, and the gate is connected to a word line drive signal WLDV, a gate of the transistor Q3 is connected to the main word line drive signal bMWL, and a drain of the transistor Q3 is connected to a word line WL. A source of the transistor Q4 is grounded, a drain of the transistor Q4 is connected to both the drain of the transistor Q3 and the word line WL, and a gate of the transistor Q4 is connected to the main word line drive signal bMWL. A source of the transistor Q5 is grounded, a drain of the transistor Q5 is connected to the drain of the transistor Q3, the drain of the transistor Q4 and the word line WL, and a gate of the transistor Q5 is connected to a word line reset signal WLRst. The local word line driver drives a state of the word line WL according to the main word line drive signal bMWL, the word line reset signal WLRst, and the word line drive signal WLDV. For example, when the intermediate decoding output signal is in the first state, the main word line drive signal bMWL outputted by the decoder driver circuit is in the non-drive state, such that the word line WL remains the nonactivated state. When the intermediate decoding output signal is in the second state, the main word line drive signal bMWL outputted by the decoder driver circuit is in the drive state, to drive the word line WL to remain the activated state.

The word line drive signal WLDV and the word line reset signal WLRst involved in the above embodiments may be implemented by using the related existing technologies, and their implementation principles are omitted in the present disclosure.

According to some embodiments, the present disclosure provides a memory chip, which includes the decoder driver circuit in any one of the embodiments of the present disclosure. The decoding control circuit is connected to a plurality of sub drive units, and the decoding control circuit generates the intermediate decoding output signal according to the enable control signal and the second decoding input signal, and provides the intermediate decoding output signal to each of the plurality of sub drive units, such that each of the plurality of sub drive units generates a main word line drive signal according to the power supply voltage signal, the first decoding input signal, and the intermediate decoding output signal. The main word line drive signal works in coordination with the word line drive signal and the word line reset signal to implement the control of the plurality of local word line drivers in the row decoder circuit. When the intermediate decoding output signal is in the first state, the main word line drive signal is in the non-drive state, such that the word line correspondingly connected to the backward stage remains the nonactivated state. When the intermediate decoding output signal is in the second state, the main word line drive signal is in the drive state, such that the word line correspondingly connected to the backward stage is driven to remain the activated state. In this embodiment, the control of the plurality of local word line drivers is implemented by controlling the plurality of sub drive units by means of one decoding control circuit, and thus a volume of the decoder driver circuit in the row decoder circuit can be reduced without reducing a storage capacity of a storage array area, to effectively reduce a volume of a peripheral circuit region of a semiconductor memory chip, such that the storage capacity per unit area can be relatively improved for the semiconductor memory chip.

It is to be noted that the above embodiments are intended for purposes of illustration only and are not intended to limit the present disclosure.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A decoder driver circuit, comprising:
a plurality of sub drive units configured to generate a main word line drive signal according to a power supply voltage signal, a first decoding input signal and an intermediate decoding output signal; and
a plurality of decoding control circuits connected to the plurality of sub drive units, the plurality of decoding control circuits being configured to generate the intermediate decoding output signal according to an enable control signal and a second decoding input signal;
wherein when the intermediate decoding output signal is in a first state, the main word line drive signal is in a non-drive state; and,
wherein each of the plurality of sub drive units comprises:
a first transistor, a source of the first transistor being connected to the power supply voltage signal, a gate of the first transistor being connected to the first decoding input signal;
a second transistor, a source of the second transistor being connected to the power supply voltage signal, a gate of the second transistor being connected to the intermediate decoding output signal; and
a third transistor, a source of the third transistor being connected to a given one of the plurality of decoding control circuits, a drain of the third transistor being connected to both a drain of the first transistor and a drain of the second transistor, and a gate of the third transistor being connected to both the gate of the first transistor and the first decoding input signal; and
the enable control signal comprises a first enable control signal and a second enable control signal, the given decoding control circuit comprising:
a first inverter, a power supply terminal of the first inverter being connected to a first power supply, an output terminal of the first inverter being connected to the gate of the second transistor;
a fourth transistor, a source of the fourth transistor being grounded, a drain of the fourth transistor being connected to the source of the third transistor, and a gate of the fourth transistor being connected to both the gate of the second transistor and the output terminal of the first inverter;

a fifth transistor, a source of the fifth transistor being connected to the first power supply, a drain of the fifth transistor being connected to an input terminal of the first inverter, and a gate of the fifth transistor being connected to both the output terminal of the first inverter and the gate of the second transistor;

a sixth transistor, a source of the sixth transistor being connected to the first power supply, a drain of the sixth transistor being connected to both the input terminal of the first inverter and the drain of the fifth transistor, and a gate of the sixth transistor being connected to the first enable control signal; and a seventh transistor, a source of the seventh transistor being connected to a second decoding signal receiver unit, a drain of the seventh transistor being connected to both the drain of the sixth transistor and the input terminal of the first inverter, and a gate of the seventh transistor being connected to the second enable control signal.

2. The decoder driver circuit according to claim 1, wherein the second decoding input signal comprises a second primary decoding input signal and a second secondary decoding input signal, the second decoding signal receiver unit comprising:

an eighth transistor, a drain of the eighth transistor being connected to the source of the seventh transistor, a gate of the eighth transistor being connected to the second primary decoding input signal; and a ninth transistor, a source of the ninth transistor being grounded, a drain of the ninth transistor being connected to the source of the eighth transistor, and a gate of the ninth transistor being connected to the second secondary decoding input signal.

3. The decoder driver circuit according to claim 2, further comprising:

an enable control circuit connected to the plurality of decoding control circuits, the enable control circuit being configured to provide the first enable control signal and the second enable control signal to the plurality of decoding control circuits according to a main word line enable signal.

4. The decoder driver circuit according to claim 3, wherein the enable control circuit comprises:

a second inverter, an input terminal of the second inverter being connected to the main word line enable signal, a power supply terminal of the second inverter being connected to the first power supply;

a third inverter, an input terminal of the third inverter being connected to an output terminal of the second inverter, a power supply terminal of the third inverter being connected to the first power supply, and an output terminal of the third inverter being configured to output the first enable control signal; and a fourth inverter, an input terminal of the fourth inverter being connected to the output terminal of the second inverter, a power supply terminal of the fourth inverter being connected to a second power supply, and an output terminal of the fourth inverter being configured to output the second enable control signal.

5. The decoder driver circuit according to claim 4, wherein an amplitude of an output voltage of the first power supply is greater than an amplitude of an output voltage of the second power supply.

6. The decoder driver circuit according to claim 1, further comprising:

a power supply control circuit connected to each of the plurality of sub drive units, the power supply control circuit being configured to provide the power supply voltage signal to each of the plurality of sub drive units; wherein the power supply control circuit is further configured to output power supply voltage signals having different voltage amplitudes according to a power supply control signal.

7. The decoder driver circuit according to claim 6, wherein the power supply control signal comprises a first sub power supply control signal and a second sub power supply control signal, the power supply control circuit comprising:

a first power supply control unit connected to a third power supply, the first sub power supply control signal and the second sub power supply control signal, the first power supply control unit being configured to generate a power supply voltage signal having a first amplitude according to the first sub power supply control signal and the second sub power supply control signal; and a second power supply control unit connected to the first power supply and an inversion signal of the second sub power supply control signal, the second power supply control unit being configured to generate a power supply voltage signal having a second amplitude according to the inversion signal of the second sub power supply control signal.

8. The decoder driver circuit according to claim 7, wherein the power supply control circuit further comprises:

a third power supply control unit connected to the first power supply and an inversion signal of the first sub power supply control signal, the third power supply control unit being configured to generate a power supply voltage signal having a third amplitude according to the inversion signal of the first sub power supply control signal.

9. The decoder driver circuit according to claim 7, wherein the first power supply control unit comprises:

a tenth transistor, a source of the tenth transistor being connected to the third power supply, a gate of the tenth transistor being connected to the first sub power supply control signal; and an eleventh transistor, a source of the eleventh transistor being connected to a drain of the tenth transistor, a gate of the eleventh transistor being connected to the second sub power supply control signal, and a drain of the eleventh transistor being configured to output the power supply voltage signal having the first amplitude.

10. The decoder driver circuit according to claim 7, wherein the second power supply control unit comprises:

a twelfth transistor, a source of the twelfth transistor being connected to the first power supply, a gate of the twelfth transistor being connected to a drain thereof; and a thirteenth transistor, a source of the thirteenth transistor being connected to a drain of the twelfth transistor, a gate of the thirteenth transistor being connected to the inversion signal of the second sub power supply control signal, and a drain of the thirteenth transistor being configured to output the power supply voltage signal having the second amplitude.

11. The decoder driver circuit according to claim 8, wherein the third power supply control unit comprises:

a fourteenth transistor, a source of the fourteenth transistor being connected to the first power supply, a gate of the fourteenth transistor being connected to the inversion signal of the first sub power supply control signal, and a drain of the fourteenth transistor being configured to output the power supply voltage signal having the third amplitude.

12. The decoder driver circuit according to claim 11, wherein an amplitude of an output voltage of the third power supply is smaller than the amplitude of the output voltage of the first power supply; and
the first amplitude is greater than the second amplitude, and the second amplitude is greater than the third amplitude.

13. A memory chip, comprising:
the decoder driver circuit according to claim 1.

14. A decoder driver circuit, comprising:
a plurality of sub drive units configured to generate a main word line drive signal according to a power supply voltage signal, a first decoding input signal and an intermediate decoding output signal; and
a plurality of decoding control circuits connected to the plurality of sub drive units, the plurality of decoding control circuits being configured to generate the intermediate decoding output signal according to an enable control signal and a second decoding input signal; wherein when the intermediate decoding output signal is in a first state, the main word line drive signal is in a non-drive state;
a power supply control circuit connected to each of the plurality of sub drive units, the power supply control circuit being configured to provide the power supply voltage signal to each of the plurality of sub drive units; wherein the power supply control circuit is further configured to output power supply voltage signals having different voltage amplitudes according to a power supply control signal;
wherein the power supply control signal comprises a first sub power supply control signal and a second sub power supply control signal, the power supply control circuit comprising:
a first power supply control unit connected to a third power supply, the first sub power supply control signal and the second sub power supply control signal, the first power supply control unit being configured to generate a power supply voltage signal having a first amplitude according to the first sub power supply control signal and the second sub power supply control signal; and
a second power supply control unit connected to the first power supply and an inversion signal of the second sub power supply control signal, the second power supply control unit being configured to generate a power supply voltage signal having a second amplitude according to the inversion signal of the second sub power supply control signal.

15. The decoder driver circuit according to claim 14, wherein the power supply control circuit further comprises:
a third power supply control unit connected to the first power supply and an inversion signal of the first sub power supply control signal, the third power supply control unit being configured to generate a power supply voltage signal having a third amplitude according to the inversion signal of the first sub power supply control signal.

16. The decoder driver circuit according to claim 14, wherein the first power supply control unit comprises:
a tenth transistor, a source of the tenth transistor being connected to the third power supply, a gate of the tenth transistor being connected to the first sub power supply control signal; and
an eleventh transistor, a source of the eleventh transistor being connected to a drain of the tenth transistor, a gate of the eleventh transistor being connected to the second sub power supply control signal, and a drain of the eleventh transistor being configured to output the power supply voltage signal having the first amplitude.

17. The decoder driver circuit according to claim 14, wherein the second power supply control unit comprises:
a twelfth transistor, a source of the twelfth transistor being connected to the first power supply, a gate of the twelfth transistor being connected to a drain thereof; and
a thirteenth transistor, a source of the thirteenth transistor being connected to a drain of the twelfth transistor, a gate of the thirteenth transistor being connected to the inversion signal of the second sub power supply control signal, and a drain of the thirteenth transistor being configured to output the power supply voltage signal having the second amplitude.

18. The decoder driver circuit according to claim 15, wherein the third power supply control unit comprises:
a fourteenth transistor, a source of the fourteenth transistor being connected to the first power supply, a gate of the fourteenth transistor being connected to the inversion signal of the first sub power supply control signal, and a drain of the fourteenth transistor being configured to output the power supply voltage signal having the third amplitude.

19. The decoder driver circuit according to claim 18, wherein an amplitude of an output voltage of the third power supply is smaller than the amplitude of the output voltage of the first power supply; and
the first amplitude is greater than the second amplitude, and the second amplitude is greater than the third amplitude.

* * * * *